United States Patent
Xiao et al.

(10) Patent No.: US 10,290,660 B2
(45) Date of Patent: May 14, 2019

(54) ARRAY SUBSTRATE, MANUFACTURING METHOD THEREOF, DISPLAY PANEL AND DISPLAY DEVICE

(71) Applicants: BOE Technology Group Co., Ltd., Beijing (CN); Beijing BOE Optoelectronics Technology Co., Ltd., Beijing (CN)

(72) Inventors: Zhilian Xiao, Beijing (CN); Haisheng Zhao, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/549,524

(22) PCT Filed: Jan. 19, 2017

(86) PCT No.: PCT/CN2017/071706
§ 371 (c)(1),
(2) Date: Aug. 8, 2017

(87) PCT Pub. No.: WO2017/181753
PCT Pub. Date: Oct. 26, 2017

(65) Prior Publication Data
US 2018/0308875 A1    Oct. 25, 2018

(30) Foreign Application Priority Data
Apr. 18, 2016  (CN) .......................... 2016 1 0239612

(51) Int. Cl.
*H01L 27/12* (2006.01)
*H01L 21/77* (2017.01)
(Continued)

(52) U.S. Cl.
CPC .......... *H01L 27/1262* (2013.01); *H01L 21/77* (2013.01); *H01L 27/12* (2013.01);
(Continued)

(58) Field of Classification Search
None
See application file for complete search history.

(56) References Cited

U.S. PATENT DOCUMENTS

| 5,113,273 A | * | 5/1992 | Mochizuki | ............. G02F 1/141 |
| | | | | 349/114 |
| 2006/0060890 A1 | * | 3/2006 | You | ................... G02F 1/133555 |
| | | | | 257/222 |

(Continued)

FOREIGN PATENT DOCUMENTS

| CN | 102096250 A | 6/2011 |
| CN | 104216190 A | 12/2014 |

(Continued)

OTHER PUBLICATIONS

Mar. 26, 2018—(CN) First Office Action Appn 201610239612.5 with English Tran.

(Continued)

*Primary Examiner* — Michael Lebentritt
(74) *Attorney, Agent, or Firm* — Banner & Witcoff, Ltd.

(57) ABSTRACT

An array substrate, a manufacturing method thereof, a display panel and a display device are provided. The array substrate includes a base substrate, and a gate layer, an active layer, a data line layer, a resin layer, a first transparent electrode and a second transparent electrode disposed on the base substrate, the first transparent electrode and the second transparent electrode being insulated from each other. The second transparent electrode is extended below the resin layer via a through hole of the resin layer, the first transparent electrode includes a hollowed-out region; and an (Continued)

orthographic projection of the through hole of the resin layer on the base substrate falls within an orthographic projection of the hollowed-out region of the first transparent electrode on the base substrate.

12 Claims, 3 Drawing Sheets

(51) Int. Cl.
    *G02F 1/1333*     (2006.01)
    *G02F 1/1362*     (2006.01)

(52) U.S. Cl.
    CPC ...... H01L 27/124 (2013.01); *G02F 1/133345* (2013.01); *G02F 1/136227* (2013.01); *G02F 1/136286* (2013.01)

(56) References Cited

U.S. PATENT DOCUMENTS

| | | | |
|---|---|---|---|
| 2009/0251653 A1* | 10/2009 | Hayashi | H01L 27/12 349/139 |
| 2012/0007088 A1 | 1/2012 | Lee et al. | |
| 2012/0176561 A1 | 7/2012 | Kim et al. | |
| 2013/0168648 A1* | 7/2013 | Jeong | H01L 27/3225 257/40 |
| 2014/0138717 A1 | 5/2014 | Kong et al. | |
| 2014/0231804 A1* | 8/2014 | Yan | H01L 27/1214 257/53 |
| 2014/0346504 A1* | 11/2014 | Misaki | H01L 21/0217 257/43 |
| 2015/0243681 A1* | 8/2015 | Sung | H01L 27/1288 257/72 |
| 2016/0211277 A1* | 7/2016 | Yan | H01L 27/1248 |
| 2016/0306241 A1 | 10/2016 | Choi | |
| 2017/0052403 A1* | 2/2017 | Iwato | G02F 1/1337 |
| 2017/0199407 A1 | 7/2017 | Yang | |
| 2017/0205662 A1* | 7/2017 | Choi | G02F 1/1368 |
| 2017/0347418 A1* | 11/2017 | Son | H05B 33/0845 |
| 2018/0061884 A1* | 3/2018 | Jun | H01L 27/14658 |

FOREIGN PATENT DOCUMENTS

| | | |
|---|---|---|
| CN | 104536194 A | 4/2015 |
| CN | 105116655 A | 12/2015 |
| CN | 105448933 A | 3/2016 |
| CN | 105810692 A | 7/2016 |

OTHER PUBLICATIONS

Apr. 26, 2017—(WO) International Search Report and Written Opinion Appn PCT/CN2017/071706—English Tran.

Nov. 9, 2018—(CN) Third Office Action Appn 201610239612.5 with English Translation.

\* cited by examiner

US 10,290,660 B2

ARRAY SUBSTRATE, MANUFACTURING METHOD THEREOF, DISPLAY PANEL AND DISPLAY DEVICE

The application is a U.S. National Phase Entry of International Application No. PCT/CN 2017/071706 filed on Jan. 19, 2017, designating the United States of America and claiming priority to Chinese Patent Application No. 201610239612.5, filed Apr. 18, 2016 . The present application claims priority to and the benefit of the above-identified applications and the above-identified applications are incorporated by reference herein in their entirey.

TECHNICAL FIELD

The disclosure relates to an array substrate, a manufacturing method thereof, a display panel and a display device.

BACKGROUND

With the continuous development of display technology, liquid crystal display (LCD) has become a mainstream display device due to the advantages of rapid response speed, high integration level, low power consumption, etc. An LCD panel generally comprises an array substrate, an opposing substrate and a liquid crystal layer disposed between the array substrate and the opposing substrate. In the current mass-produced high-definition (HD) display panels, in order to achieve low power consumption, a deposited resin layer structure is usually adopted to manufacture an array substrate. As the thickness of a resin layer is usually large, the electrical connection between different layers of the array substrate can be affected.

SUMMARY

An embodiment of the disclosure provides an array substrate, comprising: a base substrate, and a gate layer, an active layer, a data line layer, a resin layer, a first transparent electrode and a second transparent electrode disposed on the base substrate in sequence in a direction away from the base substrate, wherein the first transparent electrode and the second transparent electrode are insulated from each other; the second transparent electrode is extended below the resin layer via a through hole of the resin layer; the first transparent electrode includes a hollowed-out region; and an orthographic projection of the through hole of the resin layer on the base substrate falls within an orthographic projection of the hollowed-out region of the first transparent electrode on the base substrate.

Another embodiment of the disclosure provides a display panel, comprising: the array substrate as mentioned above, and an opposing substrate arranged opposite to the array substrate.

Another embodiment of the disclosure provides a display device, comprising the display panel as mentioned above.

Another embodiment of the disclosure a method for manufacturing an array substrate, comprising: forming patterns of a gate layer, an active layer, a data line layer and a resin layer on a base substrate in sequence; and forming patterns of a first transparent electrode and a second transparent electrode which are insulated from each other on the patterns of the resin layer in sequence, wherein the pattern of the second transparent electrode is extended below the resin layer via a through hole in the resin layer; the first transparent electrode includes a hollowed-out region; and an orthographic projection of the through hole of the resin layer on the base substrate falls within an orthographic projection of the hollowed-out region of the first transparent electrode on the base substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The thickness of layers and the size and shape of regions in the accompanying drawings do not reflect the true scale of the layers and are only intended to illustrate the content of the present invention.

Figure 1:
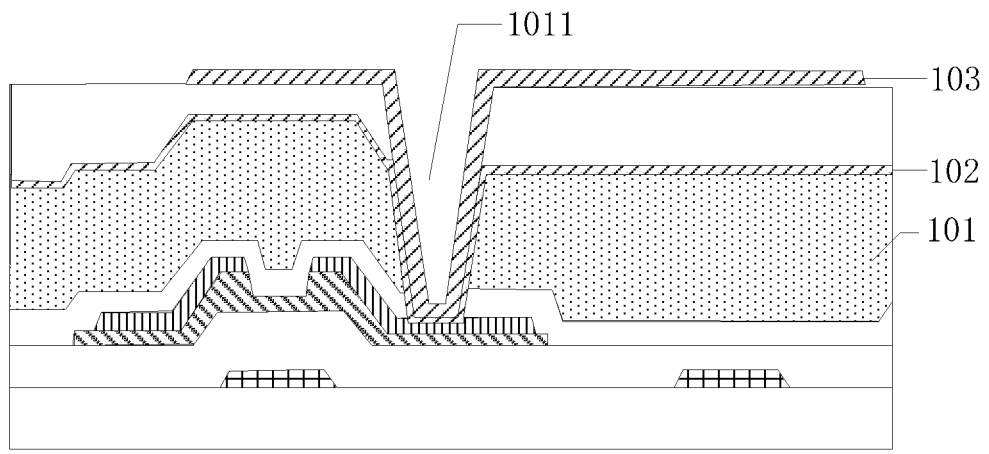
FIG. 1 is a schematic structural sectional view of an array substrate.

FIG. 1 is a schematic structural sectional view of an array substrate. As illustrated in FIG. 1, the thickness of a resin layer 101 is large, and a through hole 1011 formed in the resin layer are relatively deep. Thus, in the process of forming patterns of a first transparent electrode 102, the through hole 1011 must be subjected to exposure. Due to large depth of the through hole 1011, the bottom of the through hole 1011 is underexposed, so that a first transparent electrode layer which shall not be disposed in the through hole 1011 is retained in the through hole 1011. Thus, after a pattern of a second transparent electrode 103 is formed, the retained first transparent electrode layer is electrically connected with the second transparent electrode 103, so as to result in poor products.

The solution to the above problem may be as follows. Firstly, the means of only adopting coating and not adopting whirl coating avoids large thickness of photoresist in the deep through hole, but in this means, it is difficult to maintain the uniformity of the coating. Secondly, the amount of exposure in the deep through hole is increased and the exposure duration in the through hole is prolonged, but when the amount of exposure is increased, the through hole and the line width will also be simultaneously affected, so this means is adapted to temporary measure and has large volatility and is unsuitable for long-term use. Thirdly, inverse trapezium negative photoresist is adopted for exposure at the through hole; the lift-off technology is adopted; and an electrode layer is formed with the photoresist retained, so as to prevent the electrode layer from being retained in the through hole. In this means, as the switching application of positive photoresist and negative photoresist, the application of an inverse trapezium mask, and the application of the lift-off technology are involved, a large amount of photoresist will enter a film forming cavity, so as to pollute the film forming cavity, so mass-produced application is not suitable.

Embodiments of the present invention provide an array substrate, a display panel and a display device, which are used for solving the problem of poor products caused by the retained electrode layer in the prior art.

Figure 2:
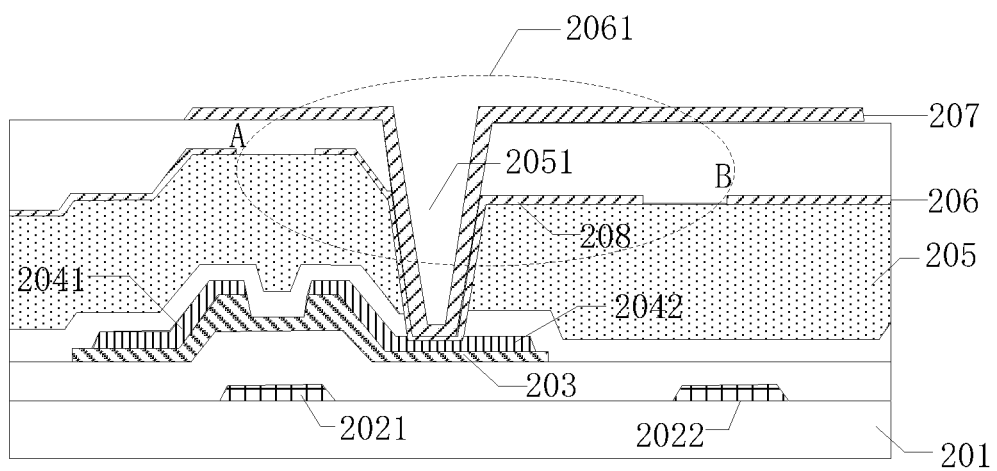
FIG. 2 is a schematic structural sectional view 1 of an array substrate provided by the embodiment of the present invention.

As illustrated in FIG. 2, the array substrate provided by the embodiment of the present invention comprises: a base substrate 201 and, for example, a gate layer, an active layer 203, a data line layer, a resin layer 205, a first transparent electrode 206 and a second transparent electrode 207 disposed on the base substrate 201 in sequence in the direction away from the base substrate.

The first transparent electrode 206 and the second transparent electrode 207 are insulated from each other; the second transparent electrode 207 is connected with components in layers disposed below the resin layer 205 via through hole 2051 in the resin layer 205; and the first transparent electrode 206 includes a hollowed-out region 2061 for covering the through hole 2051. That is to say, an orthographic projection of the through hole 2051 of the resin layer 205 on the base substrate 201 falls within an orthographic projection of the hollowed-out region 2061 of the first transparent electrode 206 on the base substrate 201.

The second transparent electrode 207 is connected with components disposed below the resin layer 205 via the through hole 2051 in the resin layer 205. That is to say, the second transparent electrode 207 is extended below the resin layer 205 via the through hole 2051 in the resin layer 205, and hence can be directly or indirectly connected with the components below the resin layer, for example, may be electrically connected with the components below the resin layer. For example, the components connected with the second transparent electrode 207 here may include a drain electrode, a common electrode line, etc. Detailed description will be given below in the preferred embodiments.

In the array substrate provided by the embodiment of the present invention, as the first transparent electrode includes the hollowed-out region, partial areas of the first transparent electrode are disconnected. Thus, even the electrode layer is retained in the through hole of the resin layer, there is no electrical connection between the first transparent electrode and the second transparent electrode, so that the problem of poor products caused by the retained electrode layer can be avoided.

For example, in the array substrate provided by the embodiment of the present invention, as illustrated in FIG. 2, the gate layer includes: a gate electrode, and a gate line 2021 and a common electrode line 2022 with a same extension direction. An orthographic projection of the hollowed-out region 2061 of the first transparent electrode 206 on the base substrate 201 falls within a region between the gate line 2021 and the common electrode line 2022. The hollowed-out region 2061 in the embodiment of the present invention is an A-B region in FIG. 2. For example, patterns must be formed as required in the A-B area, namely the hollowed-out region 2061. The region between the gate line 2021 and the common electrode line 2022 also includes regions provided with the gate line 2021 and the common electrode line 2022. In the array substrate provided by the embodiment of the present invention, the hollowed-out region 2061 is adopted to allow the first transparent electrode 206 to form disconnected areas, and the orthographic projection of the hollowed-out region 2061 on the base substrate 201 will not exceed edges of the gate line 2021 and the common electrode line 2022. As a black matrix (BM) has the function of shielding metal, by adoption of the above setting means, the hollowed-out region 2061 will not exceed the shielding range of the BM, so as to avoid the light leakage phenomenon in the process of plate test.

For example, in the array substrate provided by the embodiment of the present invention, as illustrated in FIG. 2, the data line layer includes: a source electrode 2041, a drain electrode 2042 and a data line; the first transparent electrode 206 is a common electrode and the second transparent electrode 207 is a pixel electrode; and the second transparent electrode 207 is connected with the drain electrode 2042 via the through hole 2051 in the resin layer.

Moreover, in the array substrate provided by the embodiment of the present invention, as illustrated in FIG. 2, the array substrate further comprises: a first connecting part 208 arranged in the same layer with and insulated from the first transparent electrode 206 and configured to connect the second transparent electrode 207 and the drain electrode 2042. An orthographic projection of the first connecting part 208 on the base substrate 201 falls within the hollowed-out region 2061. The first connecting part 208 is arranged in the same layer with the first transparent electrode 206, may be made from the same materials with the first transparent electrode 206, and form patterns by one patterning process. The first connecting part 208 connects the second transparent electrode 207 and the drain electrode 2042 and is disconnected with the first transparent electrode 206. Thus, the first connecting part 208 is also taken as one part of the second transparent electrode 207 to be connected with the drain electrode 2042, so as to avoid the problem of poor products caused by the electrical connection between the first transparent electrode 206 and the second transparent electrode 207.

Figure 3:
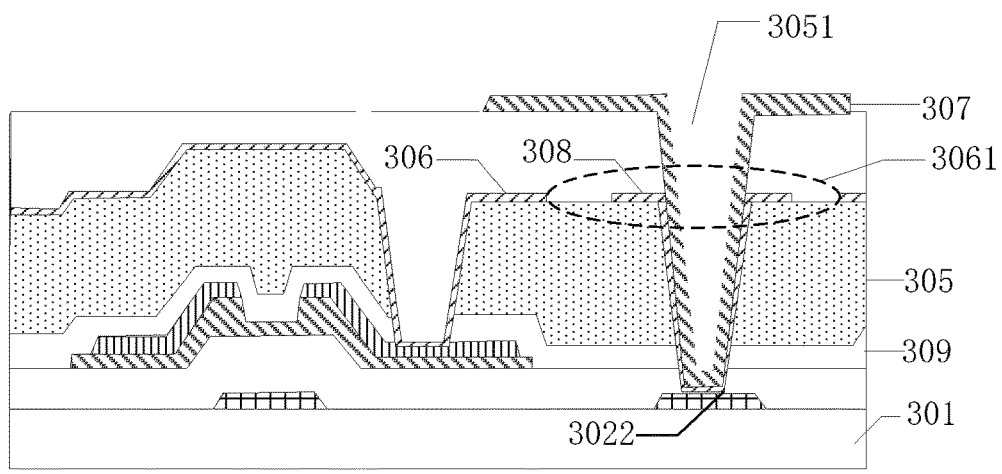
FIG. 3 is a schematic structural sectional view 2 of the array substrate provided by the embodiment of the present invention.

In another embodiment, in the array substrate provided by the embodiment of the present invention, as illustrated in FIG. 3, a first transparent electrode 306 is a pixel electrode and a second transparent electrode 307 is a common electrode; and the second transparent electrode 307 is connected with a common electrode line 3022 via a through hole 3051 of a resin layer 305.

Moreover, in the array substrate provided by the embodiment of the present invention, as illustrated in FIG. 3, the array substrate further comprises: a second connecting part 308 arranged in the same layer with and insulated from the first transparent electrode 306 and configured to connect the second transparent electrode 307 and the common electrode lines 3022. An orthographic projection of the second connecting part 308 on the base substrate 301 falls within the hollowed-out region 3061. The second connecting part 308 is arranged in the same layer with the first transparent electrode 306, may be made from the same materials with the first transparent electrode 306, and form patterns by one patterning process. The second connecting part 308 connects the second transparent electrode 307 and the common electrode line 3022 and is disconnected with the first transparent electrode 306. Thus, the second connecting part 308 is also taken as one part of the second transparent electrode 307 to be connected with the common electrode line 3022, so as to avoid the problem of poor products caused by the electrical connection between the first transparent electrode 306 and the second transparent electrode 307.

For example, in the array substrate provided by the embodiment of the present invention, as illustrated in FIG. 3, an insulating buffer layer 309 is also disposed beneath the resin layer 305. The insulating buffer layer 309 can increase the adhesion between the resin layer 305 and the lower layer, and may have same patterns with the resin layer 305.

It should be noted that the first transparent electrode and the second transparent electrode may be insulated from each other through an insulating layer. Thus, when the second transparent electrode runs through the through hole of the resin layer, the second transparent electrode will also run through the insulating layer between the first transparent electrode and the second transparent electrode. In addition, the second transparent electrode may also run through the buffer layer beneath the resin layer.

Figure 4:
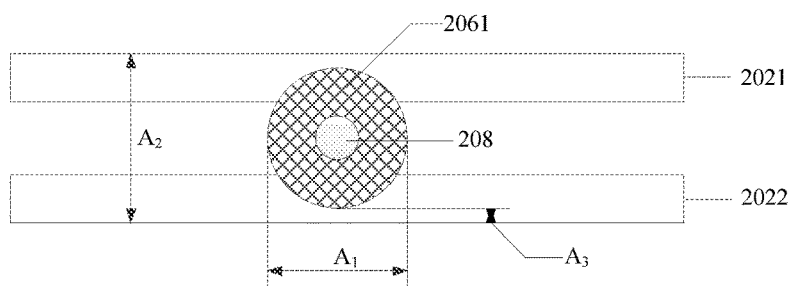
FIG. 4 is a top view of a hollowed-out region in the array substrate provided by the embodiment of the present invention.

In specific implementation, in the array substrate provided by the embodiment of the present invention, the shape of the hollowed-out region of the first transparent electrode is circular or rectangle and may also be set to be other shapes as required. No limitation will be given here. Description will be given below by taking the case that the hollowed-out region 2061 of the first transparent electrode is circular as an example. FIG. 4 is a top view of the hollowed-out region 2061 of the first transparent electrode. As illustrated in FIG. 4, the shape of the hollowed-out region 2061 is circular; and an orthographic projection of the first connecting part 208 for connecting the second transparent electrode and the drain electrode falls within the hollowed-out region 2061. As illustrated in FIG. 4, the diameter $A_1$ of the hollowed-out region 2061 does not exceed the distance $A_2$ between the gate line 2021 and an outer edge of the common electrode line 2022. This setting can avoid the light leakage phenomenon in the process of plate test. For example, as exposure equipment has certain exposure line width, the distance between both sides of the hollowed-out region 2061 and the gate line 2021 and the common electrode line 2022 can be kept the distance of at least the exposure line width $A_3$ during operation, so as to prevent the hollowed-out region 2061 from exceeding the edges of the gate line 2021 and the common electrode line 2022. For example, the line width of the exposure equipment is 4 μm, and the distance $A_2$ between the gate line 2021 and the common electrode line 2022 is 20 μm. In order to avoid the problem caused by hole offset, the distance $A_3$ between the hollowed-out region 2061 and upper and lower edges of the gate line 2021 and the common electrode line 2022 is kept the space of 4 μm respectively, so the diameter of the hollowed-out region 2061 is 12 μm. For example, exposure equipment with other line widths may be adopted; the hollowed-out region may include a pattern; the pattern of the hollowed-out region is annular; and rectangular or other patterns may also be formed according to actual demands. No specific limitation will be given here in the embodiment of the present invention.

Based on the same invention concept, the embodiment of the present invention further provides a method for manufacturing the array substrate. As the principle of solving problem of the method is similar to the foregoing array substrate, the embodiments of the method may refer to the embodiments of the array substrate. No further description will be given here.

For example, the method for manufacturing the array substrate, provided by the embodiment of the present invention, comprises the following steps:

forming patterns of a gate layer, an active layer, a data line layer and a resin layer on a base substrate in sequence; and forming patterns of a first transparent electrode and a second transparent electrode which are insulated from each other on the patterns of the resin layer, in which the pattern of the second transparent electrode is connected with components in layers below the resin layer via through hole of the resin layer; and the pattern of the first transparent electrode includes an hollowed-out region for covering the through hole.

As the first transparent electrode includes the hollowed-out region, partial areas of the first transparent electrode are disconnected. Thus, even the electrode layer is retained in the through hole of the resin layer, there is no electrical connection between the first transparent electrode and the second transparent electrode, so as to avoid the problem of poor products caused by the retained electrode layer.

Figure 5:
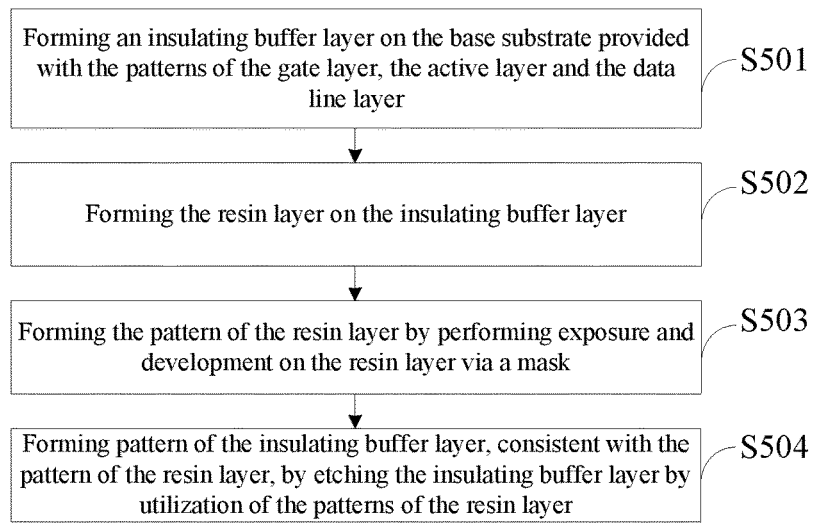
FIG. 5 is a flow diagram of a manufacturing process of a resin layer in the array substrate provided by the embodiment of the present invention.

For example, in the method for manufacturing the array substrate, provided by the embodiment of the present invention, as illustrated in FIG. 5, the step of forming the patterns of the resin layer on the base substrate provided with the patterns of the gate layer, the active layer and the data line layer may be implemented by the following steps:

S501: forming an insulating buffer layer on the base substrate provided with the patterns of the gate layer, the active layer and the data line layer;

S502: forming the resin layer on the insulating buffer layer;

S503: forming the pattern of the resin layer by performing exposure and development on the resin layer via a mask; and S504: forming a pattern of the insulating buffer layer, consistent with the patterns of the resin layer, by etching the insulating buffer layer by utilization of the patterns of the resin layer.

As the buffer layer is formed before the resin layer is formed, the adhesion between the resin layer and the lower layer can be reinforced. The remaining manufacturing processes are similar to the method for manufacturing the array substrate in the prior art. No further description will be given here.

Figure 6:
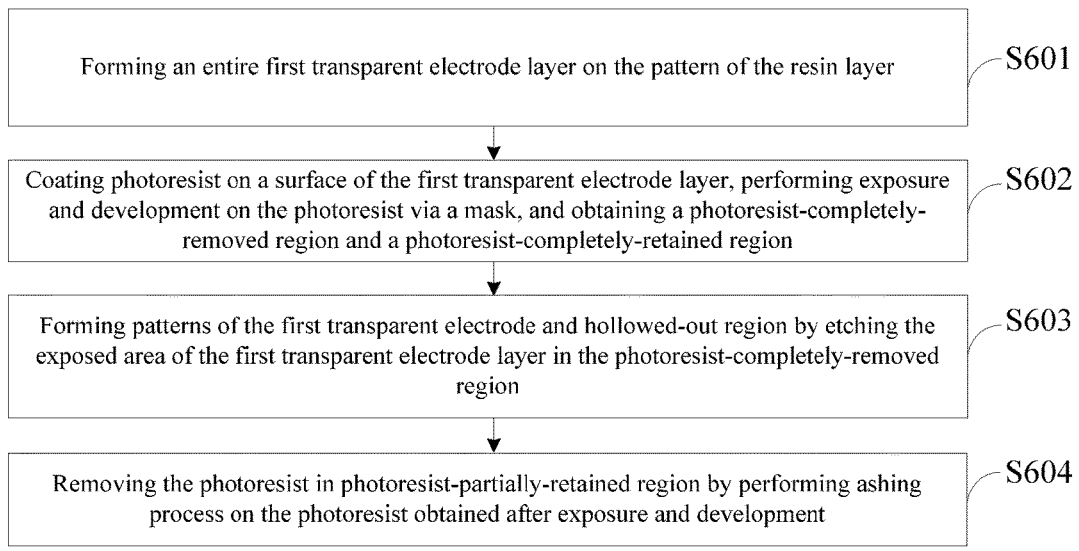
FIG. 6 is a flow diagram of a manufacturing process of a first transparent electrode in the array substrate provided by the embodiment of the present invention.

For example, in the method for manufacturing the array substrate, provided by the embodiment of the present invention, as illustrated in FIG. 6, the step of forming the pattern of the first transparent electrode on the base substrate provided with the pattern of the resin layer may be implemented by the following steps:

S601: forming an entire first transparent electrode layer on the pattern of the resin layer;

S602: coating photoresist on a surface of the first transparent electrode layer, performing exposure and development on the photoresist via a mask, and obtaining a photoresist-completely-removed region and a photoresist-completely-retained region;

S603: forming patterns of the first transparent electrode and hollowed-out region by etching exposed areas of the first transparent electrode layer in the photoresist-completely-removed region; and S604: removing the photoresist in photoresist-partially-retained region by performing ashing process on the photoresist obtained after exposure and development.

The first transparent electrode and the hollowed-out region may be formed by one patterning process, so the manufacturing process of the array substrate can be reduced. As the pattern of the hollowed-out region is formed simultaneously, the problem of poor products, caused by the fact that the materials of the first transparent electrode are retained in the through hole, can also be avoided.

The embodiment of the present invention further provides a display panel, which comprises any foregoing array substrate provided by the embodiment of the present invention, and an opposing substrate arranged opposite to the array substrate.

For example, the display panel provided by the embodiment of the present invention further comprises: a black matrix (BM) disposed on a side of the array substrate facing the opposing substrate or a side of the opposing substrate facing the array substrate. An orthographic projection of the BM on the base substrate completely covers the hollowed-out region of the first transparent electrode. The above arrangement allows the hollowed-out region to not exceed the shielding range of the BM, and hence can avoid the light leakage phenomenon in the process of plate test.

The embodiment of the present invention further provides a display device. The display device may be: any product or component with display function such as a mobile phone, a tablet PC, a television, a display, a notebook computer, a digital picture frame and a navigator. Other necessary components of the display device shall be understood by those skilled in the art to be included, will not be further described here, and shall not be construed as the limitation of the present invention. The embodiments of the display device may refer to the embodiments of the array substrate. No further description will be given here.

In summary, the array substrate, the manufacturing method thereof, the display panel and the display device, provided by the embodiment of the present invention, comprise: a base substrate, and a gate layer, an active layer, a data line layer, a resin layer, a first transparent electrode and a second transparent electrode disposed on the base substrate in sequence, wherein the first transparent electrode and the second transparent electrode are insulated from each other; the second transparent electrode is connected with components in layers disposed below the resin layer via through hole in the resin layer; and an orthographic projections of the first transparent electrode on the array substrate includes a hollowed-out region for covering the through hole. As the first transparent electrode includes the hollowed-out region, even the electrode layer is retained in the through hole of the resin layer, there is no electrical connection between the first transparent electrode and the second transparent electrode, so the problem of poor products caused by the retained electrode layer can be avoided.

The foregoing is only the preferred embodiments of the present invention and not intended to limit the scope of protection of the present invention. The scope of protection of the present invention should be defined by the appended claims.

The application claims priority to the Chinese patent application No. 201610239612.5, filed Apr. 18, 2016, the disclosure of which is incorporated herein by reference as part of the application.

The invention claimed is:

1. An array substrate, comprising: a base substrate, and a gate layer, an active layer, a data line layer, a resin layer, a first transparent electrode and a second transparent electrode disposed on the base substrate in sequence in a direction away from the base substrate, wherein
the first transparent electrode and the second transparent electrode are insulated from each other;
the second transparent electrode is extended below the resin layer via a through hole of the resin layer;
the first transparent electrode includes a hollowed-out region; and an orthographic projection of the through hole of the resin layer on the base substrate falls within an orthographic projection of the hollowed-out region of the first transparent electrode on the base substrate;
the gate layer includes: a gate electrode, and a gate line and a common electrode line with a same extension direction; and
the orthographic projection of the hollowed-out region of the first transparent electrode on the base substrate falls within a region between the gate line and the common electrode line.

2. The array substrate according to claim 1, wherein the data line layer includes: a source electrode, a drain electrode and a data line;
the first transparent electrode is a common electrode and the second transparent electrode is a pixel electrode; and
the second transparent electrode is connected with the drain electrode via the through hole of the resin layer.

3. The array substrate according to claim 2, further comprising: a first connecting part arranged in a same layer with and insulated from the first transparent electrode, wherein the first connecting part connects the second transparent electrode and the drain electrode, and an orthographic projection of the first connecting part on the base substrate falls within the orthographic projection of the hollowed-out region on the base substrate.

4. The array substrate according to claim 1, wherein the first transparent electrode is a pixel electrode and the second transparent electrode is a common electrode; and
the second transparent electrode is connected with the common electrode line via the through hole of the resin layer.

5. The array substrate according to claim 4, further comprising: a second connecting part arranged in the same layer with and insulated from the first transparent electrode, wherein the second connecting part connects the second transparent electrode and the common electrode line, and an orthographic projection of the second connecting part on the base substrate falls within the orthographic projection of the hollowed-out region on the base substrate.

6. The array substrate according to claim 1, wherein the hollowed-out region of the first transparent electrode has a shape of circular or rectangle.

7. A display panel, comprising: the array substrate according to claim 1, and an opposing substrate arranged opposite to the array substrate.

8. The display panel according to claim 7, further comprising: a black matrix disposed on a side of the array substrate facing the opposing substrate or a side of the opposing substrate facing the array substrate, wherein
the orthographic projection of the hollowed-out region of the first transparent electrode on the base substrate falls within an orthographic projection of the black matrix on the base substrate.

9. A display device, comprising the display panel according to claim 7.

10. A method for manufacturing an array substrate, comprising:
forming patterns of a gate layer, an active layer, a data line layer and a resin layer on a base substrate in sequence; and
forming patterns of a first transparent electrode and a second transparent electrode which are insulated from each other on the patterns of the resin layer in sequence, wherein the pattern of the second transparent electrode is extended below the resin layer via a through hole in the resin layer; the first transparent electrode includes a hollowed-out region; and an orthographic projection of the through hole of the resin layer on the base substrate falls within an orthographic projection of the hollowed-out region of the first transparent electrode on the base substrate, the gate layer includes: a gate electrode, and a gate line and a common electrode line with a same extension direction, and the orthographic projection of the hollowed-out region of the first transparent electrode on the base substrate falls within a region between the gate line and the common electrode line.

11. The method according to claim 10, wherein the data line layer includes: a source electrode, a drain electrode and a data line;

the first transparent electrode is a common electrode and the second transparent electrode is a pixel electrode; and the second transparent electrode is connected with the drain electrode via the through hole of the resin layer.

12. The method according to claim 10, wherein the first transparent electrode is a pixel electrode and the second transparent electrode is a common electrode; and the second transparent electrode is connected with the common electrode line via the through hole of the resin layer.

* * * * *